(12) United States Patent
Murata

(10) Patent No.: US 6,501,533 B1
(45) Date of Patent: Dec. 31, 2002

(54) SCANNING TYPE EXPOSURE APPARATUS AND METHOD

(75) Inventor: Minoru Murata, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/676,811

(22) Filed: Oct. 2, 2000

Related U.S. Application Data

(60) Continuation of application No. 09/226,112, filed on Jan. 7, 1999, now abandoned, which is a division of application No. 08/728,063, filed on Oct. 9, 1996, now abandoned.

(30) Foreign Application Priority Data

Oct. 16, 1995 (JP) ............................................. 7-266917

(51) Int. Cl.⁷ ........................ G03B 27/42; G03B 27/54; G03B 27/58
(52) U.S. Cl. ............................. 355/53; 355/67; 355/72
(58) Field of Search ............................ 355/53, 55, 72; 356/399, 401, 400, 363; 250/548

(56) References Cited

U.S. PATENT DOCUMENTS

| | | |
|---|---|---|
| 4,905,041 A | 2/1990 | Aketagawa |
| 4,924,257 A | 5/1990 | Jain |
| 5,140,366 A | 8/1992 | Shiozawa et al. |
| 5,142,156 A | 8/1992 | Ozawa et al. |
| 5,144,363 A | 9/1992 | Wittekoek et al. |
| 5,160,957 A | 11/1992 | Ina et al. |
| 5,194,893 A | 3/1993 | Nishi |
| 5,295,073 A | 3/1994 | Celette |
| 5,390,025 A | 2/1995 | Morita et al. |
| 5,448,332 A | 9/1995 | Sakakibara et al. |
| 5,473,410 A | 12/1995 | Nishi |
| 5,477,304 A | 12/1995 | Nishi |
| 5,525,808 A | 6/1996 | Irie et al. |
| 5,568,257 A | 10/1996 | Ota et al. |
| 5,585,925 A | 12/1996 | Sato et al. |
| 5,627,627 A | 5/1997 | Suzuki |
| 5,760,878 A | 6/1998 | Ogushi |
| 5,777,722 A * | 7/1998 | Miyazaki et al. ............. 355/53 |
| 5,883,701 A * | 3/1999 | Hasegawa et al. ............ 355/53 |
| 5,978,071 A | 11/1999 | Miyajima et al. |

FOREIGN PATENT DOCUMENTS

| | | |
|---|---|---|
| JP | A-6-132191 | 5/1994 |
| JP | A-6-349712 | 12/1994 |
| JP | A-7-135132 | 5/1995 |

* cited by examiner

Primary Examiner—Alan A. Mathews
Assistant Examiner—Peter B. Kim
(74) Attorney, Agent, or Firm—Oliff & Berridge PLC

(57) ABSTRACT

Effects of synchronization control errors on subsequent processes are reduced when such synchronization control errors occur in a scanning type (e.g., step-and-scan) exposure apparatus. A reticle stage controller that controls the driving of a reticle stage, a focus controller that controls a focusing position on a wafer, a blind controller that controls a shape of an aperture formed by a movable blind, and an exposure controller that controls the intensity of light incident on the wafer are controlled with as much precision as is possible, but typically have synchronization control errors. Synchronization control errors for each controller are determined, e.g., by each controller, and are supplied to a main control system that can be, e.g., a higher rank controller. The main control system displays, e.g., through a warning apparatus, shot areas in which the synchronization control errors exceed an allowable range. Such shot areas are referred to as poor shots. The poor shots are eliminated from being exposure targets in subsequent exposure processes (e.g., for layers applied above the layer causing the poor shot) and also are eliminated from being used as sample shots in subsequent alignment processes.

19 Claims, 4 Drawing Sheets

SCANNING TYPE EXPOSURE APPARATUS AND METHOD

This is a Continuation of application Ser. No. 09/226,112 filed Jan. 7, 1999 abandoned: which in turn is a Divisional of application Ser. No. 08/728,063 filed Oct. 9, 1996 abandoned. The entire disclosure of the prior application(s) is hereby incorporated by reference herein in its entirety.

BACKGROUND OF THE INVENTION

1. Field of the Invention

The present invention relates to exposure apparatus and methods used in photolithographic processes to produce, for example, semiconductor elements (e.g., chips), liquid crystal display elements, image pick-up elements (e.g., camera CCDs), thin film magnetic heads, and the like. The present invention is particularly applicable to scanning type exposure apparatus using a so-called step-and-scan method that successively exposes patterns on a mask onto each shot area on a photosensitive substrate while simultaneously moving (scanning) the mask and the substrate in synchronization in predetermined scanning directions.

2. Description of Related Art

Conventionally, a batch exposure type projective exposure apparatus, such as a stepper, has been used to manufacture semiconductor elements or the like using a photolithographic technology. Such apparatus expose images of patterns on a reticle used as a mask through a projective optical system and onto each shot area on a wafer (or a glass plate) on which photoresist or the like. has been applied. Typically, these projective exposure apparatus have used a so-called step-and-repeat method in which the entire pattern from the reticle is exposed onto the wafer shot area (i.e., the area where one chip. is formed) in one shot. The wafer is then stepped to the next position, and this process is repeated until the requisite number of shot areas on the wafer have been exposed. This process typically is repeated many times, using different reticle patterns to build up the various circuits, for example, on the plurality of chips formed on the wafer.

Difficulties have risen in using the step-and-repeat method due to the trend in the semiconductor industry to produce chips having larger sizes. Due to the larger size chips, the reticle patterns, and the resulting image that is exposed through the projective optical system, also has been made larger. This requires the exposure field of the projective optical system to be made larger, which causes the projective optical system to become more complicated in order to maintain aberrations within an allowable range throughout the entire exposure field. This increases the already high manufacturing cost, and causes the projective optical system to become large, which results in the entire body of the apparatus becoming too large.

In order to respond to the demand for increasing the area of the transferred pattern without enlarging the exposure field of the projective optical system, a scanning exposure type projective exposure apparatus using the so-called step-and-scan method has been developed. The step-and-scan method successively transfers and exposes patterns on a reticle onto each shot area on a wafer by scanning the reticle and the wafer synchronously with respect to the projective optical system so that, at any instant in time, a portion of the pattern of the reticle is projected onto the wafer through the projective optical system.

In the projective exposure apparatus, the patterns on the reticle are successively transferred to each shot area of the wafer by synchronizing and controlling a substrate (or wafer) stage that determines the position of the substrate and a reticle stage that determines the position of the reticle. Additionally, synchronizing and controlling of the substrate stage, an automatic focus (AF) system, a movable field diaphragm (a movable blind) in the illumination optical system, an exposure amount controlling mechanism, and the like are also performed. Any error that remains during exposure after performing the synchronization control (referred to hereafter as "a synchronization control error") causes a degradation of the transferred images or a registration error (i.e., an alignment error between a recently exposed image and an underlying image). Therefore, the various systems of the scanning exposure type projective exposure apparatus need to be dynamically controlled in parallel so that they are synchronized with respect to time (i.e., the timing by which they operate) and space (i.e., their position).

In the conventional scanning projective exposure apparatus, the patterns on the reticle are transferred onto each shot area on the substrate by synchronizing and dynamically controlling the reticle and substrate stage driving mechanisms, the automatic focus mechanism, the movable blind mechanism, the exposure amount control mechanism, and the like. However, small spatial and time synchronization control errors occur due to response speeds of the control systems that dynamically drive these various mechanisms, disturbances, and the like. Conventionally, an observation (that is, monitoring and storing) of the synchronization control errors that might occur during exposure is not specifically accomplished. When a shot area on which the pattern of the reticle is not accurately transferred due to an occurrence of a synchronization control error (referred to hereafter as "a poor shot") occurs, the procedure simply moves to the next process (e.g., exposure of the next shot area) without recording the poor shot. Additional exposure (e.g., with different mask patterns) are performed, and the resulting chip is ultimately determined to be a poor chip, for example, after the chip is tested. Therefore, there is an inconvenience in that unnecessary exposures are performed on the poor shot area until the resulting chip is tested and determined to be a poor chip.

Moreover, the above poor shot could be selected as a sample shot when performing alignment in accordance with an enhanced global alignment (EGA) method, which creates further problems. As is known, the EGA method calculates arrangement coordinates of all shot areas on the wafer by using an alignment sensor that detects a position of an alignment mark on the wafer to measure a position of a plurality of sample shot areas selected from all shot areas on the wafer, and then statistically processes the measurement results. If the poor shot is selected, there is a possibility that position data of all shot areas will be significantly affected.

SUMMARY OF THE INVENTION

It is an object of embodiments of the present invention to provide a scanning type exposure apparatus that can reduce adverse effects to subsequent processes even when synchronization control errors occur.

In order to achieve the above and other objects, and to address the shortcomings in the prior art, a scanning exposure apparatus and method according to embodiments of the invention stores positional information relating to one or more areas on a substrate (e.g., a wafer) where one or more synchronization errors are detected to be greater than a predetermined value. The areas where the detected synchronization errors are greater than the predetermined value can then be eliminated from further exposure processing. Accordingly, throughput (productivity) is improved because time is not wasted exposing areas on the substrate that ultimately would yield defective devices (e.g., chips). Additionally, the areas where the detected synchronization errors are greater than the predetermined value can be eliminated from being used as sample areas during subsequent alignment processes, thereby avoiding the problems that can arise when such poor shot areas are used for alignment.

According to one embodiment of the invention, a scanning. exposure apparatus includes an illumination system a projection optical system a scanning system an error detecting system and a memory. The illumination system is located between a light source and a mask illuminated with light from the light source The projection optical system is located between the mask and a substrate and projects an image of an illuminated pattern from the mask onto the substrate. The scanning system synchronously moves the mask and the substrate so as to expose each of plural areas on the substrate with the pattern. The error detecting system detects an error in synchronous scanning of the mask and the substrate for each area. The memory stores positional information relating to one or more areas on the substrate where the detected error is more than the predetermined value.

The scanning system can include a mask stage that moves the mask relative to light from the light source, and a substrate stage that moves the substrate relative to light from the illuminated pattern. In such a case, the error detecting system can detect a positional error in synchronous movement of the mask stage and the substrate stage during scanning exposure of each area.

The scanning exposure system also can include an optical sensor that outputs a signal corresponding to a difference between an imaging plane of the projection optical system and the substrate in a direction along an optical axis of the projection optical system. For example, the optical sensor is part of an auto-focussing systems. In such a case, the error detecting system can also detect a focussing error in accordance with the signal output by the optical sensor.

The illumination system can include a stop member that is driven in response to movement of the mask relative to light output from the light source during scanning exposure. In such a case, the error detecting system can also detect an error in driving of the stop member.

The scanning exposure system also can include a light detector that outputs a signal corresponding to an intensity of light output by the light source and incident on the substrate. In such a case, the error detecting system can also detect an illuminance error in accordance with the signal output by the light detector.

The scanning exposure system also can include a display that indicates the one or more areas to be distinguished from other areas on the substrate. Additionally, a warning device can be provided that indicates when the errors exceed the predetermined value. for example, the warning device can indicate the location(s) of the area(s) on the substrate where the error(s) exceeded the predetermined value.

The memory can also store the synchronization control errors in correlation with the locations of the areas on the substrate the synchronization control errors were detected to be greater than the predetermined value Another aspect of embodiments of the invention relates to a method of manufacturing a device using the scanning exposure apparatus. Such a method includes the steps of: synchronously moving a mask and a substrate so that each of plural areas on the substrate is exposed with a pattern from the mask; detecting an error in the synchronous moving of the mask and of the substrate for each of the areas; and exposing areas on the substrate for which the error is less than a predetermined value with another pattern, while eliminating areas on the substrate for which the error is greater than the predetermined value from exposure with the another pattern. The method can include the step of storing identifying information of one or more of the areas on the substrate for which the error is greater than the predetermined value so that, e.g., those areas can be eliminated from further processing. The error can include at least one of a positional error between the pattern and the substrate, an error in movement of a field stop that defines an illumination area on the mask, and an error in a light intensity in the illumination area. The error can also include a positional error between each area and the pattern, at least one of a focussing error in a direction along an optical axis of the projection optical system, and an alignment error in a plane perpendicular to the optical axis.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

A first example of an embodiment of the present invention is described hereafter with reference to FIGS. 1–3 and FIG. 5. This example shows an application of the present invention to a projective exposure apparatus using a step-and-scan method that successively transfers and exposes the pattern on a reticle onto each shot area on a substrate by synchronizing and scanning the reticle and the substrate with respect to the projective optical system. For further details on projective exposure apparatus that use the step-and-scan method, see, for example, U.S. Pat. Nos. 5,477,304 and 4,924,257, both of which are incorporated herein by reference in their entireties. As indicated in the above patents, apparatus that use the step-and-scan method simultaneously move the reticle stage and the substrate stage in synchronism (although typically at different speeds (due to the reduction projective optical system preferably used) and in different (opposite) directions), while projecting light through the reticle and onto the substrate. The light forms an area (the illumination area) on the reticle and on the substrate. The illumination area can have a variety of shapes such as, for example, rectangular, arcuate or hexagonal.

Figure 1:
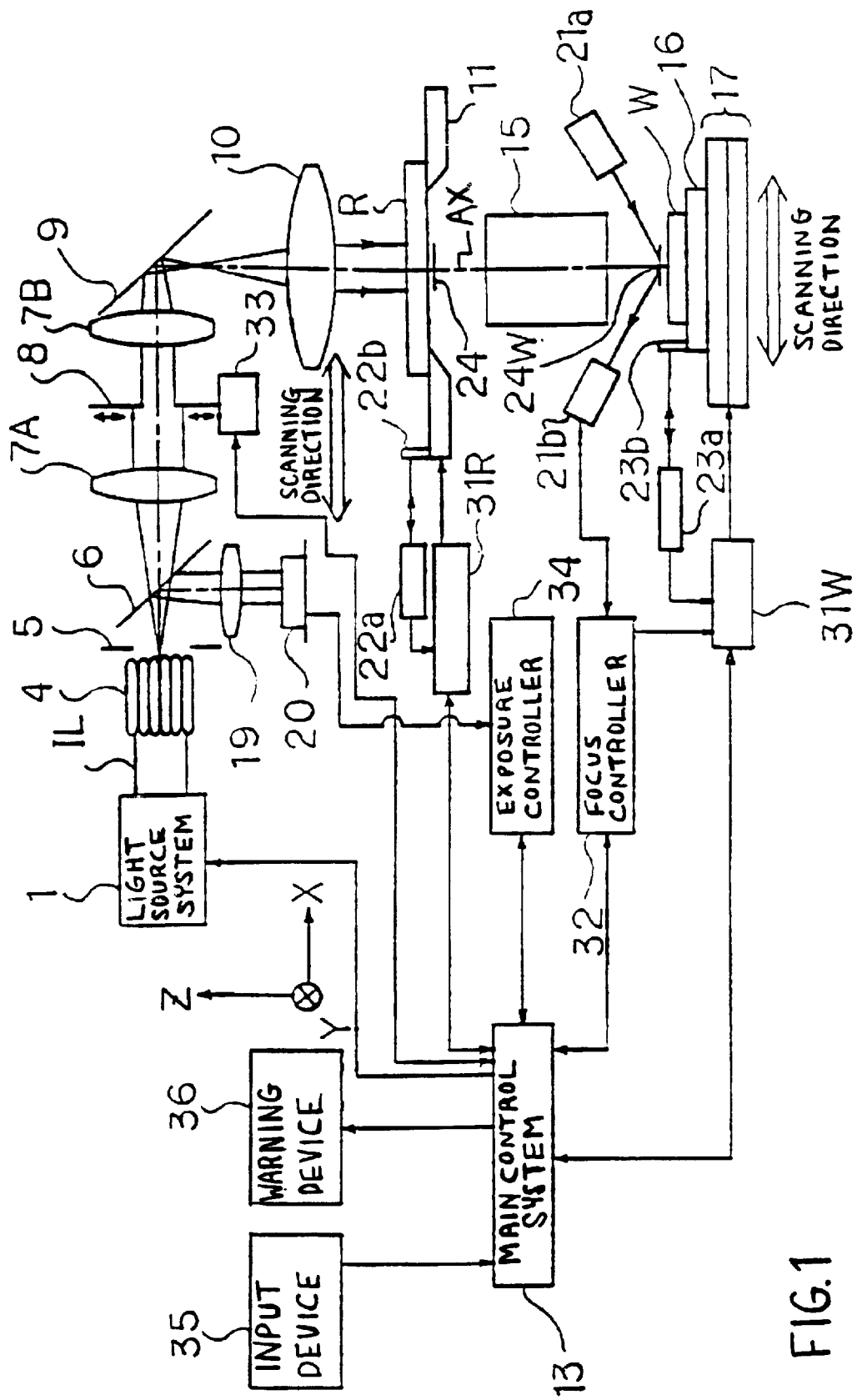
FIG. 1 is a schematic block diagram of a scanning type. projective exposure apparatus according to one embodiment of the present invention.

FIG. 1 shows an example of a projective exposure apparatus. In FIG. 1, illumination light IL is projected from a light source system 1 that includes a light reduction unit that adjusts the intensity of the light source. The light emitted from light source system 1 enters a fly-eye lens 4. The light source system 1 is controlled by a main control system 13, which adjusts the intensity of the illumination light IL supplied to the wafer W by controlling the light source and the light reduction portion of the light source system 1. The illumination light IL can be produced by, for example, a KrF excimer laser, an ArF excimer laser, a copper vapor laser or a YAG laser that produces high-frequency waves, an extremely high pressure mercury lamp that provides a luminescent line (e.g. a "g" line or an "i" line) in an ultraviolet area, or the like. The light reduction portion of the light source system 1 is a device through which the laser beam is transmitted, and can be used to control the intensity of the laser beam. For example, the light reduction portion typically includes a plurality of attenuating filters mounted on a turret or on a slide, which can be used to vary the intensity of the light output from the light source system 1. Thus, the light reduction portion can be used to vary (i.e., control) the intensity of the light output by light source system 1, maintaining the light intensity at desired levels. See, for example, U.S. patent application Ser. No. 08/260,398, filed Jun. 14, 1994, the disclosure of which is incorporated herein by reference in its entirety.

The fly-eye lens 4 forms multiple secondary light sources so as to illuminate the following field diaphragm 8 and the reticle R with a distribution of equal intensity. An aperture stop 5 of the illumination system is positioned at the light emitting surface of the fly-eye lens 4. The illumination light emitted from the secondary light sources through the aperture stop 5 enters a beam splitter 6 having a reflection factor that is small and a transmission factor that is large. The illumination light transmitted through the beam splitter 6 passes through a first relay lens 7A and then through an aperture of field diaphragm 8. The field diaphragm 8 includes at least one movable blind. The field diaphragm 8 can include a fixed blind and a movable blind, or plural movable blinds. See, for example, U.S. Pat. No. 5,194,893. Hereafter, field diaphragm 8 will be referred to as "movable blind 8."

The movable blind 8 in this example is positioned on a conjugate surface with respect to the pattern surface of the reticle and is comprised so that the width in the scanning direction and a position of a rectangular opening formed by the movable blind 8 can be continuously changed by a blind controller 33. The blind controller 33 is controlled by the main control system 13, which is a higher ranked controller than blind controller 33. By opening and closing the movable blind 8 through the blind controller 33 in response to commands from the main control system 13, the illuminating area of the illumination light IL that reaches the reticle R (and the wafer W) is continuously adjusted so that exposure of areas other than the desired shot area is prevented. Movement of blind 8 also varies the size of the illumination area so as to control the dose of exposure received by the substrate. See, for example, the above-incorporated U.S. patent application Ser. No. 08/260,398. The synchronization control error δB, which is an amount of displacement (i.e., the difference) between the actual position of the movable blind 8 and a desired (predetermined) position, is supplied to the main control system 13 from the blind controller 33.

The illumination light that passes through the opening defined by the movable blind 8 illuminates reticle R on reticle stage 11 with an equally distributed intensity at an illumination area 24 having the shape, for example, of a slit after passing through a second relay lens 7B, a light path deflection mirror 9, and a main condenser lens 10.

The image of the pattern in the illumination area 24 on the reticle is transmitted through a projective optical system 15 so as to be projected and exposed onto the exposure area 24W on the wafer W. The pattern in the illumination area 24 is reduced with a projective magnification of β (e.g., in a reduction optical system, β typically is 1/4 or 1/5) and transferred onto the exposure area 24W on the wafer W on which photoresist has been applied.

The following explanation assumes that illumination area 24 is in the shape of a slit. A Z axis is, as shown in FIG. 1, the axis that is parallel to the optical axis AX of the projective optical system 15. A scanning direction of the reticle R with respect to the slit shaped illumination area 24 is referred to as the X direction and is in a plane perpendicular to the Z axis, as shown in FIG. 1. A non-scanning direction perpendicular to the scanning direction is referred to as the Y direction, and extends out of the page in FIG. 1.

The reticle R is placed on the reticle stage 11 through a reticle holder, not shown in the figure. The reticle stage 11 defines the position of the reticle R by moving in two dimensions in the plane (i.e., the XY plane) perpendicular to optical axis AX, and is movable with a fixed scanning velocity in the scanning direction (i.e., the X direction). The reticle stage 11 moves through a stroke in which at least the entire surface of the reticle R crosses the optical axis AX in the scanning direction (i.e., to expose one shot area). A movable mirror 22b that reflects a laser beam from a reticle interferometer 22a is provided on an end of the reticle stage 11. The position of the reticle stage 11 is continuously monitored by the movable mirror 22b and the reticle interferometer 22a. Position data of the reticle stage 11 from the reticle interferometer 22a is sent to the reticle stage controller 31R and is supplied to the main control system 13 through the reticle stage controller 31R. The main control system 13 controls the position and the speed of the reticle stage 11 through the reticle stage controller 31R based on this data.

The wafer W is held, e.g., by a vacuum on a wafer holder, which is not shown in the figure and which is placed on a Z tilt stage 16. The Z tilt stage 16 is placed on a substrate stage 17, which is driven in the X direction and in the Y direction through a substrate stage controller 31W. The step-and-scan operation, which repeats a scanning and exposure process onto each shot area on the wafer W and an action to move (i.e., step) to the next scanning exposure start position is accomplished by the substrate stage 17. The Z tilt stage 16 enables the wafer to be moved in a Z direction and the surface of the wafer W to be inclined with respect to the XY plane within a fixed range.

A movable mirror 23b that reflects a laser beam from a substrate interferometer 23a is provided on an end of the Z tilt stage 16 on the substrate stage 17. The position of the Z tilt stage 16 (and thus of the substrate stage 17) is continuously monitored by the movable mirror 23b and the substrate interferometer 23a. Position data of the Z tilt stage 16 from the substrate interferometer 23a is sent to the substrate stage controller 31W and is supplied to the main control system 13, which is a higher rank controller than the substrate stage controller 31W. The main control system 13 controls the position and the speed of the wafer W through the substrate stage controller 31W based on this position data.

During scanning exposure (i.e., exposure of a shot area), scanning of the reticle R is synchronized to scanning of the wafer W by driving the reticle stage 11 at a velocity $V_R$ in the +X direction (or in the −X direction) while driving the substrate stage 17 at a velocity $V_W$ in the −X direction (or in the +X direction) with respect to the illumination area 24. A ratio between the scanning velocity $V_R$ and the scanning velocity $V_W$ ($V_W/V_R$) is controlled to be a value that matches as accurately as is possible the projective magnification β of the projective optical system 15 with which the pattern image on the reticle R is transferred to each shot area on the wafer W.

The portion of the illumination light IL reflected by the beam splitter 6 passes through a condenser lens 19 and is received by an integrator sensor 20, which is comprised, for example, of a photoelectric conversion element such as a photodiode. A photoelectric conversion signal from the integrator sensor 20 is supplied to an exposure controller 34 through an amplifier and an analog/digital convertor, not shown in the drawings. The photoelectric conversion signal from the integrator sensor 20 is also supplied to the main control system 13 through the exposure controller 34. The relationship between the value of the photoelectric conversion signal measured at the integrator sensor 20 and the intensity of the illumination light on the surface of the wafer W are predetermined. (This is done because the various optical elements located between beam splitter 6 and wafer W affect the intensity of the light that reaches the wafer. Thus, the intensity measured at integrator 20 is not the same as the intensity that actually exists at wafer W. Accordingly, prior to exposing a wafer, a measurement is taken of the intensity of light source system 1 provided to the wafer location and to the integrator 20 to establish the relationship between these two values.) Accordingly, the intensity of light incident on the wafer W is calculated in the exposure controller 34 from the strength of the photoelectric conversion signal provided by integrator 20. The exposure controller 34 also calculates the synchronization control error δE, which indicates differences between the intensity incident on the wafer and a target (predetermined) light intensity value, and supplies the result to the main control system 13.

An oblique incident type auto focus (AF) system that detects a focusing position (i.e., a position in the z direction) of the surface of the wafer W also is provided in the apparatus as shown in FIG. 1. One preferred AF system is disclosed in U.S. Pat. No. 5,448,332, the disclosure of which is incorporated herein by reference in its entirety. This AF system is comprised of an irradiation optical system 21a and a photoreceptive optical system 21b. Irradiation optical system 21a supplies a detecting light for forming pinhole images or slit images towards an exposing surface diagonally with respect to the optical axis of the projective optical system 15. Photoreceptive optical system 21b forms the pinhole image or the like onto a vibrating slit from reflected light flux of the detecting light off the surface of the wafer W, the light flux that is transmitted through the vibrating slit being received by system 21b. This AF system is referred to hereafter as "focusing position detecting systems 21a and 21b."

The focusing position detecting systems 21a and 21b output a focus signal corresponding to a position in the Z direction with respect to the best image forming surface (image plane) of the projective optical system 15 on the surface of the wafer W. The focus signal is used to control driving of the Z tilt stage 16 so that the wafer W and the projective optical system 15 are maintained at a fixed distance. The focus signal from the focusing position detecting systems 21a and 21b is sent to a focus controller 32 and supplied to the main control system 13 through the focus controller 32. The main control system 13 controls an operation of the Z tilt stage 16 through the focus controller 32 and the substrate stage controller 31 based on the detected position. In addition, the focus controller 32 calculates the synchronization control error δF, which is an amount of displacement (i.e., the difference) between the image forming surface and a desired (predetermined) focus position on the wafer W, and supplies the result to the main control system 13.

An input device 35 comprising, for example, a keyboard, and a warning device 36 comprising, for example, a CRT display are provided for the main control system 13. Data is input through the input device 35, and warning and displaying to an operator or the like are accomplished through the warning device 36. In addition, a plurality of alignment sensors for positioning each shot area of the reticle R and the wafer W are positioned in the exposure apparatus in the present embodiment, although not shown in the drawings.

Hereafter, structures of the control systems in the present embodiment of the scanning type exposure apparatus are described.

Figure 3:
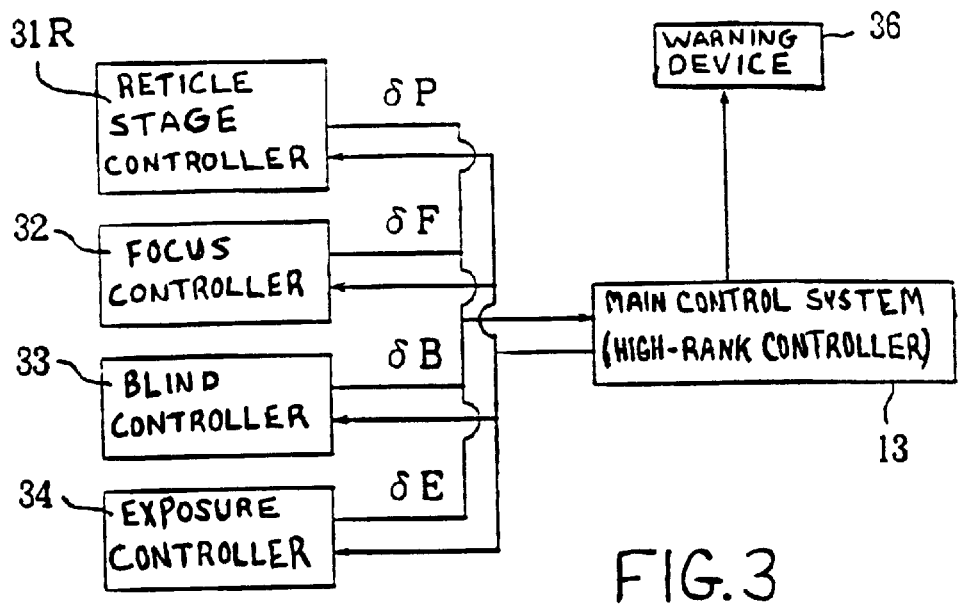
FIG. 3 is a block diagram showing the main control systems of the projective exposure apparatus of FIG. 1.

FIG. 3 is a block diagram of the main control systems of the projective exposure apparatus. In FIG. 3, each type of operation is ordered from the main control system 13, which is a higher rank controller, to the reticle stage controller 31R, the focus controller 32, the blind controller 33, and the exposure controller 34, which are lower rank controllers. In other words, the main controller 13 provides the data that is to be used by the lower rank controllers (for example, drive velocities and positions, focus state, blind position and timing), while the lower rank controllers directly control the respective systems in accordance with the data from main controller 13. The various controllers operate the reticle stage 11, the Z tilt stage 16, which adjusts the focus position, the movable blind, and the light source system 1 in FIG. 1, respectively, based on the order of the operations supplied from the main controller 13.

The position of the reticle stage 11 in FIG. 1 is determined so as to correspond to the position of the substrate stage 17 during scanning exposure. When the position of the substrate stage- 17 is first determined (e.g., by an alignment sensor, not shown in the drawings), the position of the substrate stage 17 is measured by the wafer interferometer 23a. The measurement results are supplied to the main control system 13 through the substrate stage controller 31W. The main control system 13 then determines the desired position of the reticle stage 11 and supplies this data to the reticle stage controller 31R. This process continues during the scanning exposure operation. Accordingly, the position and the speed of the reticle stage 11 in the X direction are controlled based on the position and the speed of the substrate stage 17 in the X direction. During such control of the reticle stage 11, the actual position of the reticle stage 11 is measured by the reticle interferometer 22a. A displacement (i.e., a difference) between the desired (predetermined) value, which was supplied to the reticle stage controller 31R from the main control system 13, and the actual value measured by the reticle interferometer 22a is calculated by the reticle stage controller as the synchronization control error δP. Such displacements result in projection magnification errors or distortions of the pattern image formed on the wafer W (see for example, U.S. patent application Ser. No. 08/533,923 filed on Sep. 26, 1995, the disclosure of which is incorporated herein by reference. in its entirety). The synchronization control error δP is supplied to the main control system 13 and stored in an internal memory of the main control system 13 in correspondence with the position of the substrate stage 17. Thus, by referring to the memory, it can be determined that a particular shot area (corresponding to the substrate stage 17 position) was formed with a particular synchronization control error δP.

The synchronization control error δF, which is the displacement amount (the difference) between the desired image forming surface (or image plane) and the actual image forming surface (or image plane), is calculated at the focus controller 32 from the data of the focus position of the wafer W supplied from the focus position detecting systems 21a and 21b. The value of δF also is supplied to the main control system 13 and stored in memory (e.g., internal memory) in correspondence with the substrate stage 17 position. The synchronization control error δB, which is the amount of displacement (i.e., the difference) between the desired position and the actual position of the opening of the movable blind 8, is determined by the blind controller 33 and is supplied to the main control system 13, where it is stored in memory in correspondence with the scanning position of the substrate stage 17.

The synchronization control error δE related to the exposure intensity (intensity of the illumination light provided by light source system 1 for exposure) is supplied to the main control system 13 from the exposure controller 34, where it is stored in memory in correspondence with the position of substrate stage 17. As described earlier, the data of the exposure intensity on the wafer W is obtained from the integrator sensor 20 and is continuously supplied to the exposure controller 34. The exposure controller 34 calculates the amount of displacement (i.e., the difference) between a predetermined value for the exposure intensity (supplied from the main control system 13) and a measured value (supplied from the integrator sensor 20) and supplies this amount of displacement to the main control system 13 as the synchronization control error δE.

The synchronization control error values of, for example, δP, δF, δB and δE can be continuously stored in memory in correspondence with the position of the substrate stage 17 when those synchronization control values are measured. The synchronization control error values then can be correlated to a particular shot area, based on the substrate stage 17 position data, so that, for example a maximum value for each variable (δP, δF, δB and δE) can be determined for each shot area. Those values then can be accessed to determine whether any of the shot areas are poor shot areas. Rather than storing synchronization error values for each measured position, the values of variables δP, δF, δB and δE can be updated while exposure of a particular shot area is taking place so that upon completion of exposure of the particular shot area, each variable will have a value corresponding to the highest synchronization control error value that occurred during exposure of that particular shot area. These values then can be stored in memory and subsequently accessed to determine whether the particular shot area is a poor shot area.

In the apparatus described above, the main control system 13 provides a warning to the operator or the like through the warning device 36 if necessary based on the values of each of the synchronization control errors δP, δF, δB, and δE supplied from the reticle stage controller 31R, the focus controller 32, the blind controller 33, and the exposure controller 34, respectively. Warning device 36 can be, for example, an audio alarm, such as a buzzer or voice warning device, a video alarm such as an error display, or a combination thereof.

Next, an example of the exposure operation of the scanning type exposure apparatus according to the present embodiment having the above structure is described.

Figure 2:
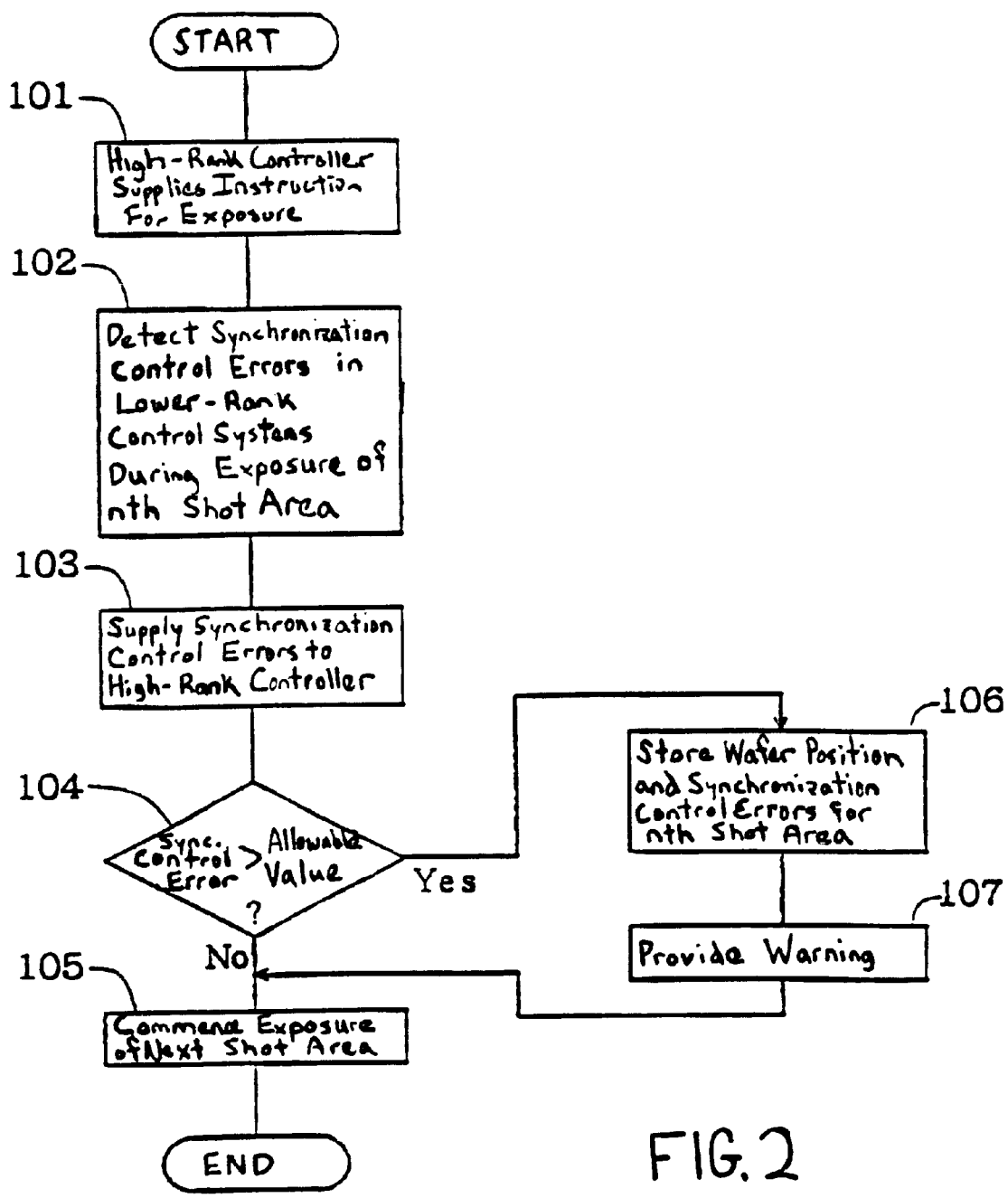
FIG. 2 is a flowchart showing an example of exposure operations in the projective exposure apparatus of FIG. 1.

FIG. 2 is a flowchart illustrating the exposure operation in the present embodiment. As shown in FIG. 2, first, an order to expose the n-th shot area is supplied from the main control system 13, which is the higher rank controller, to each of the lower rank controllers in step 101. This order can include, for example, the various desired (target) values to be used by the lower rank subsystems. Then, in step 102, the operation for scanning exposure is commenced by the lower rank controllers, namely the reticle stage controller 31R, the substrate stage controller 31W, the focus controller 32, the blind controller 33, and the exposure controller 34. These lower rank controllers detect and store their respective synchronization control errors during the performance of the scanning exposure operation, as described earlier. The detected synchronization control errors are supplied to the main control system 13 in step 103. The supplied synchronization control errors are stored in correspondence with the data indicating the n-th shot area and the position x of the substrate stage 17 in the X direction.

Figure 5:
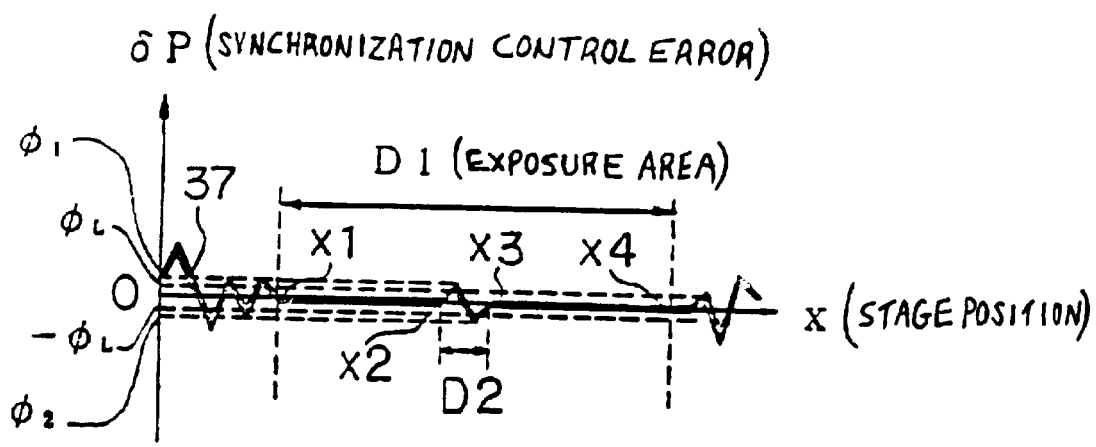
FIG. 5 is a graph illustrating the relationships between positions of stages and synchronization control errors.

FIG. 5 shows an example of the synchronization control error δP of the reticle stage controller, in which the horizontal axis shows a position x of the substrate stage. 17 in the scanning direction (i.e., the X direction) and the vertical axis shows the synchronization control error δP of the reticle stage 11. As shown by curve 37 in FIG. 5, the synchronization control error δP of the reticle stage 11 fluctuates between the positive and negative sides after starting to approach the position x1 where exposure starts, which is where this value converges substantially to zero. Exposure is then started at position x1. The synchronization control error δP, which had been converged substantially to zero, remains at zero for a while, but then suddenly diverges from zero, at a position x2, before converging substantially to zero again, at a position x3, after fluctuating between the positive and negative sides in an area D2 from the position x2 to the position x3. From the position x4, where the exposure is completed, a fluctuation in accordance with a deceleration of both stages occurs. Thus, the synchronization control error δP becomes large in an area D2, which is a part of the exposure area (an area in the scanning direction of the shot area), between the position x1 and the position x4, and therefore, degradation of the projected image on the wafer W occurs. The value of this synchronization control error δP is supplied to the main control system 13, which is the higher rank controller, from the reticle stage controller 31R in step 103 in FIG. 2.

Figure 6:
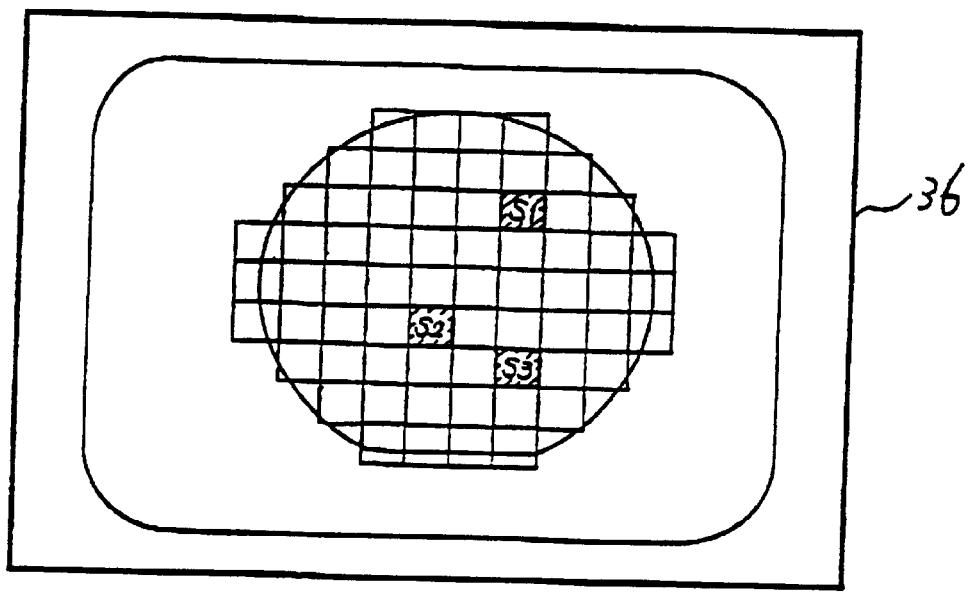
FIG. 6 is a front view of one example of a display that can be used to indicate positions of poor shots on a wafer in which synchronization errors have occurred.

Next, in step 104, the main control system 13 compares the synchronization control error δP stored in the main control system 13 with an allowable error amount $\phi_L$. If the entire extent of the absolute value of the measured synchronization control error δP is within the range of the allowable amount $\phi_L$, the process moves to step 105 to commence the exposure operation in the next shot area. On the other hand, if the measured synchronization control error δP exceeds the allowable amount $\phi_L$ even in only a portion of the exposure area, the process moves to the step 106. A range of the position x (indicated as the area D2 in FIG. 5) of the substrate stage 17 at the time when the absolute value of the synchronization control error 5P exceeded the allowable amount $\phi_L$, the number (n) of the shot area, and the maximum value $\phi_1$ and the minimum value $\phi_2$ of the synchronization control error δP in the area D2 are stored in the internal memory, and this n-th shot area is determined to be a poor shot area. In step 107, for example, poor shot areas (shaded areas S1, S2 and S3) are displayed on a CRT display that functions as a warning device 36 as shown in FIG. 6 so that such areas can be distinguished from other shot areas.

The process then returns to step 105. The synchronization control errors δF, δB, and δE from the focus controller 32, the blind controller 33, and the exposure controller 34, respectively, are processed simultaneously and in a similar fashion. The main control system 13 stores these synchronization control errors, also in correspondence to the position of the substrate stage 17 in the X direction and the number (n) of the shot area, for example.

After completing the exposure of all of the shot areas, the next exposure is again accomplished after processing such as, for example, etching, evaporation, and the like. However, the shot areas that were determined to be poor shot areas during the previous exposure process are eliminated from the subsequent exposure processes. When an EGA-type alignment process is performed, as disclosed in U.S. Pat. Nos. 4,780,617 and 4,833,621, in which some areas are selected from among the plurality of areas on the wafer as sample shots and then alignment of the plurality of areas on the wafer is performed based on positions of marks of the sample shots, according to the present invention, the areas determined to be poor shots are eliminated from being candidates for selection as sample shots. Both of these elimination steps can be done automatically by the main controller 13, for example, or can require operator intervention (e.g., they can be done manually).

The projective exposure apparatus of the present embodiment includes the reticle stage controller 31R, which monitors the synchronization control errors between the reticle stage 11 and the substrate stage 17, the focus controller 32, which monitors the synchronization control error of the focus position, the blind controller 33, which monitors the synchronization control error at the position of the opening of the movable blind, and the exposure controller 34, which monitors the synchronization control error of the light intensity (exposure amount) on the wafer W. The main control system 13 compares each of the synchronization control errors with the corresponding allowable range of values. If any one of the synchronization control errors exceeds its allowable range, the shot area thereof is determined to be a poor shot area and is eliminated from being targeted during the next exposure process and from being used as a sample shot, resulting in chip checking being accomplished in an early stage of the chip manufacturing process. Therefore, the time to process the poor shots in the subsequent exposure processes is saved, and the throughput (productivity) increases. Moreover, the accuracy of exposure and the throughput increases because the poor shots will not be selected as sample shots.

In particular, and as shown in the area D2 in FIG. 5, in the scanning type exposure apparatus, if the control errors occur only during a portion of the exposure, a problem occurs that only the images in that portion are degraded. Because detecting this type of defective chip in later processes is difficult, detecting the defective chip immediately after exposure, which is accomplished by the present embodiment, becomes more effective.

Next, an example of a variation of the present embodiment is described with reference to FIG. 4. The present embodiment provides a dedicated monitoring (detection) unit separately from each of the lower rank controllers, i.e., the reticle stage controller 31R, the focus controller 32, the blind controller 33, and the exposure controller 34, by which the synchronization control errors are monitored.

Figure 4:
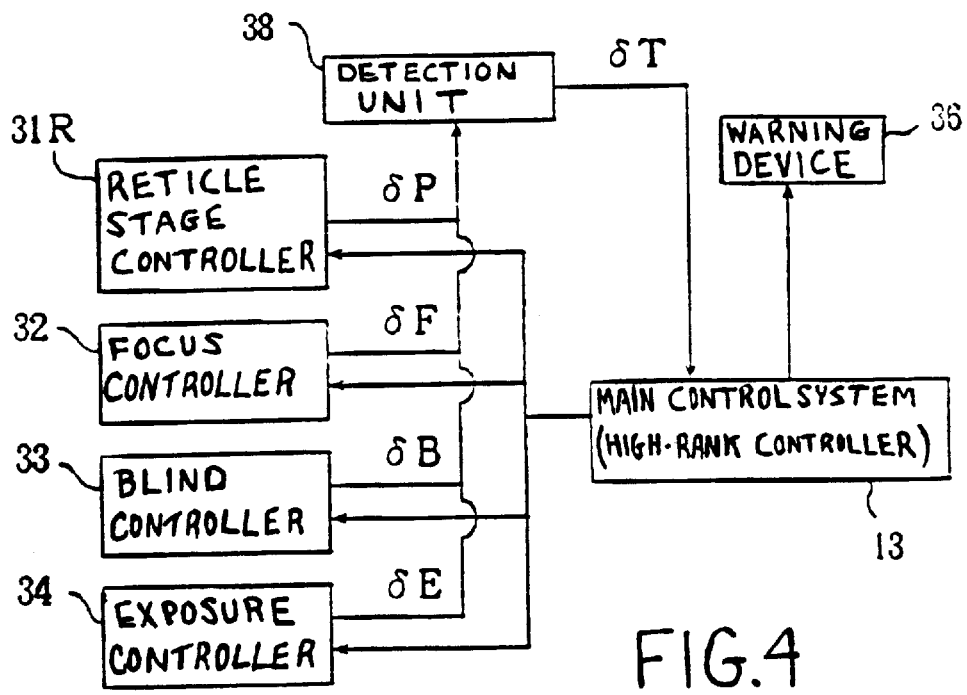
FIG. 4 is a block diagram showing a variation of the FIG. 3 control systems.

FIG. 4 is a block diagram of the control systems of the alternative embodiment. In FIG. 4, a detection unit 38 is provided separately from the lower rank controllers and monitors each of the synchronization control errors δP, δF, δB, and δE. That is, the synchronization control errors detected at the reticle stage controller 31R, the focus controller 32, the blind controller 33, and the exposure controller 34 are supplied to the detection unit 38. Values of those synchronization control errors are temporarily stored in the detection unit 38 until exposure of the shot area during that exposure operation has been completed. The synchronization control error δT of a portion of the shot area where one or more of the values exceed its respective fixed allowable range of values and the position data of that portion are supplied to the main control system 13 by detection unit 38 when exposure the shot area is completed. The main control system 13 determines that the shot area is a poor shot area based on the data of the synchronization control error δT received from the detection unit 38. When it is a poor shot area, the position in the X direction of the substrate stage 17 and the number (n) of the shot area are stored in the internal memory of the main control system 13. Other operations are the same as the operations in FIG. 3.

Use of detection unit 38 to gather the synchronization control errors for portions that exceed the respective allowable range of values, and to supply such values to the main control system 13, which is the higher rank controller, after completion of exposure is advantageous because the main control system 13 is freed from performing additional complicated operations during exposure.

In the illustrated embodiment, the exposure apparatus controller is implemented as a single special central processor section 13 for overall, system-level control, and separate, lower rank control systems (e.g., 31R, 31W, 32, 33, 34, 38) are dedicated to performing various different specific computations, functions and other processes under control of the central processor section 13. It will be appreciated by those skilled in the art that the controller can also be implemented using a plurality of separate dedicated or programmable integrated or other electronic circuits or devices (e.g., hardwired electronic or logic circuits such as discrete element circuits, or programmable logic devices such as PLDS, PLAs, PALs or the like). The controller can also be implemented using a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the flowchart shown in FIG. 2 can be used as the controller. As shown, a distributed processing architecture is preferred for maximum data/signal processing capability and speed.

When using the scanning type exposure apparatus according to the present invention, there is an advantage obtained from detecting the synchronization control errors during the scanning exposure and by storing those errors in correspondence with the exposure position on the substrate when those control errors exceed an allowable range of values, in that adverse effects on subsequent process caused by the synchronization control errors are reduced, while productivity is increased by eliminating unnecessary exposure.

There is another advantage in that when the detected synchronization control errors are the synchronization control errors between the reticle stage and the substrate stage, the synchronization errors of both stages that affect the exposure accuracy the most among all of the synchronization control errors are detected in early stages of the chip production process.

Furthermore, there is another advantage that when a warning device displays the exposure position on the substrate where the control errors exceed the fixed allowable range of values, because the position on the substrate on which the control errors exceed the allowable range of values is displayed by the warning device, the defective position of exposure on the substrate is detected in early stages of chip production.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A device manufacturing method comprising:
   synchronously moving a mask and a substrate in respective scanning directions so that one area on the substrate is exposed with a pattern of the mask during scanning exposure operation, wherein during the scanning exposure operation, positional information of the substrate is detected and the mask is moved based on the detected positional information of the substrate;
   detecting a synchronous positional error between the mask and the substrate during the scanning exposure operation, the synchronous positional error remaining after moving the mask based on the detected positional information of the substrate; and
   storing, during the scanning exposure operation, information on relationship between the synchronous positional errors and positions in the scanning direction of the substrate.

2. The method according to claim 1, wherein during the scanning exposure operation, positional information of the mask is detected and the synchronous positional error is obtained by detecting the positional information of the mask after moving the mask based on the detected positional information of the substrate.

3. The method according to claim 1, further comprising:
   performing a focussing operation during the scanning exposure operation;
   detecting a synchronous focussing error which remains after performing the focussing operation; and
   storing, during the scanning exposure operation, relationship between the synchronous focussing errors and positions in the scanning direction of the substrate.

4. The method according to claim 3, wherein the synchronous focussing error includes a difference between a target surface and a surface of the substrate after performing the focussing operation.

5. The method according to claim 1, further comprising:
   synchronously performing a dose control during the scanning exposure operation;
   detecting a synchronous error in the dose control during the scanning exposure operation; and
   storing, during the scanning exposure operation, relationship between the synchronous errors in the dose control and positions in the scanning direction of the substrate.

6. The method according to claim 1, further comprising:
   moving an optical stop member which defines an irradiation area of an exposure beam with which the substrate is exposed, synchronously with the movement of the mask;
   detecting a synchronous error in the movement of the optical stop member; and
   storing, during the scanning exposure operation, relationship between the synchronous errors in the movement of the optical stop member and positions in the scanning direction of the substrate.

7. A device manufacturing method comprising performing a lithography process utilizing the method defined in claim 1.

8. A method for making a scanning exposure apparatus in which a pattern of a mask is transferred onto one shot area on a substrate by moving the mask and the substrate synchronously in respective scanning directions, the method comprising:
   providing an illumination system between a light source and the mask, that illuminates the mask with light from the light source;
   providing a projection optical system between the mask and the substrate, that projects a pattern image onto the substrate;
   providing a synchronous system which has a mask driving system, a substrate driving system, a mask interferometer and a substrate interferometer and which moves the mask and the substrate synchronously during scanning exposure operation, wherein during the scanning exposure operation, the substrate interferometer detects positional information of the substrate and the mask driving system moves the mask based on the detected positional information of the substrate;
   providing a detecting system that detects a synchronous positional error between the mask and the substrate during the scanning exposure operation, the synchronous positional error remaining after moving the mask based on the detected positional information of the substrate; and
   providing a memory, connected with the detecting system, that stores information on relationship between the synchronous positional errors and positions in the scanning direction of the substrate during the scanning exposure operation.

9. A scanning exposure method comprising:
   moving a stage in a scanning direction during scanning exposure of one shot area of an object held on the stage, while synchronously performing a focussing operation, the focussing operation including a detection of a difference between a target surface and a surface of the one shot area, and an adjustment of positional relationship between the target surface and the surface of the one shot area based on the detected difference;
   detecting, during the scanning exposure, a synchronous focussing error which remains after performing the focussing operation; and
   storing, during the scanning exposure, information on relationship between the detected synchronous focussing errors and positions in the scanning direction of the stage.

10. The scanning exposure method according to claim 9, wherein the synchronous focussing error includes a difference between a target surface and the surface of the one shot area.

11. The scanning exposure method according to claim 9, further comprising:
   synchronously performing a dose control of irradiation provided to the one shot area of the object during the scanning exposure;
   detecting a synchronous error in the dose control during the scanning exposure; and storing, during the scanning exposure, information on relationship between the detected synchronous errors in the dose control and positions in the scanning direction of the stage.

12. The scanning exposure method according to claim 9, further comprising:

moving a stage that holds an original which has a pattern to be projected onto the one shot area of the object, synchronously with the movement of the stage that holds the object during the scanning exposure;

detecting a synchronous error in positional relationship between the original and the object during the scanning exposure; and storing, during the scanning exposure, information on relationship between the detected synchronous errors in the positional relationship and positions in the scanning direction of the stage that holds the object.

13. The scanning exposure method according to claim 9, further comprising:

moving an optical stop member which defines an irradiation area of an exposure beam that is incident on the object, synchronously with the movement of the stage that holds the object during the scanning exposure;

detecting a synchronous error in the moving of the optical stop member during the scanning exposure; and storing, during the scanning exposure, information on relationship between the detected synchronous errors in the moving of the optical stop member and positions in the scanning direction of the stage that holds the object.

14. The scanning exposure method according to claim 9, wherein the synchronous focussing error is detected for each of plural areas on the object; and further comprising:

eliminating areas on the object from subsequent scanning exposure operations when the detected synchronous focussing error for those areas is greater than a predetermined value.

15. The scanning exposure method according to claim 9, wherein the synchronous focussing error is detected for each of plural areas on the object; and further comprising:

performing an alignment operation with respect to the plural areas, without using areas for which the detected focussing error is greater than a predetermined value.

16. A device manufacturing method comprising performing a lithography process utilizing the method defined in claim 9.

17. A scanning exposure method comprising:

moving a stage in a scanning direction during scanning exposure of one shot area of an object held on the stage, while synchronously performing an operation, the operation including a detection of a difference and an adjustment based on the detected difference;

detecting, during the scanning exposure, synchronous errors which remain after performing the operation; and storing, during the scanning exposure, information on relationship between the detected synchronous errors and positions in the scanning direction of the stage.

18. The method of claim 17, wherein the operation includes a focussing operation, the difference includes a difference between a target surface and a surface of the one shot area on the object, the adjustment includes an adjustment of positional relationship between the target surface and the surface of the object, and the synchronous errors include synchronous focussing errors.

19. A device manufacturing method comprising performing a lithography process utilizing the method defined in claim 17.

* * * * *